(12) United States Patent
Fayyaz

(10) Patent No.: US 6,335,651 B1
(45) Date of Patent: Jan. 1, 2002

(54) LOW VOLTAGE MIXER

(75) Inventor: Nader Fayyaz, Ottawa (CA)

(73) Assignee: SiGe Microsystems Inc., Ottawa (CA)

( * ) Notice: Subject to any disclaimer, the term of this patent is extended or adjusted under 35 U.S.C. 154(b) by 0 days.

(21) Appl. No.: 09/725,046

(22) Filed: Nov. 29, 2000

(51) Int. Cl.$^7$ ........................................................ G06F 7/44
(52) U.S. Cl. ............................................. 327/359; 455/326
(58) Field of Search ........................................ 327/355–361; 455/326

(56) References Cited

U.S. PATENT DOCUMENTS 5,945,878 A * 8/1999 Westwick et al. ............ 330/301

* cited by examiner

Primary Examiner—Toan Tran
Assistant Examiner—Cassandra Cox

(74) Attorney, Agent, or Firm—Freedman & Associates

(57) ABSTRACT

A mixer is designed to operate from a low voltage power source connected via a power terminal and ground and includes a balanced mixer circuit with a balanced input port for receiving local oscillator signals, and a pair of input terminals. A biasing circuit includes, an active voltage divider connected between the power terminal and ground to provide higher and lower voltages at first and second voltage taps. A differential driver circuit includes first and second transistors, collectors of which are each direct coupled to separate ones of the pair of input terminals. The first transistor has a base coupled via a capacitor to a single ended receive signal terminal, and an emitter coupled via a first resistor to ground. The second transistor has a base coupled via a capacitor to grounds, and an emitter coupled via a second resistor to the single ended receive signal terminal. The single ended receive signal terminal is also coupled with ground via an impedance element, in one example third resistor. A fourth resistor is connected between the first voltage tap and the base of the second transistor and, a fifth resistor is connected between the second voltage tap and the base electrode of the first transistor.

9 Claims, 3 Drawing Sheets

LOW VOLTAGE MIXER

FIELD OF THE INVENTION

The invention is in the field of radio frequency mixers for converting a received radio frequency signal to a signal of another frequency and more particularly relates to power efficient mixers for use in small portable apparatus and the like where voltage and current are typically limited by a meagre battery supply.

DISCUSSION OF THE PRIOR ART

Mixers, are used for converting a signal of one frequency to another frequency, often referred to as an intermediate frequency signal. The intermediate frequency signal is usually intended for selective filtering in a pass band filter, preparatory to, for example, further processing, detection or amplification. In a so called superheterodyne radio receiver for example, from among received signals a signal of a frequency of interest is selected by mixing the signals with an appropriate frequency signal, from another signal source usually an adjustable local oscillator. A mixer includes a nonlinear element such as a diode or a transistor biased to operate in a nonlinear portion of its operating characteristics. A balanced mixer has the advantage of balancing out the local oscillator frequency and the received signal frequencies leaving only the sum and difference frequencies to be filtered.

One example is disclosed in U.S. Pat. No. 4,636,663 issued Jan. 13, 1987 to A. Jongpier et al. A double balanced RF mixer circuit includes two differential amplifiers each of which comprises a pair of transistors the emitters of which are connected in common and the bases of which are cross-coupled to provide common first and second base terminals to which an oscillator signal is applied. A radio frequency signal to be mixed is applied to a voltage-current converter comprising a pair of transistors connected as a balanced common base circuit, the collectors of such transistors being coupled to the common-emitter terminals of the differential amplifiers.

A more recent example is disclosed in U.S. Pat. No. 5,805,987 issued on Sep. 8, 1998 to F. Kamase and titled Double Balanced Mixer Circuit With Less Power Consumption. The double balanced mixer circuit includes two single balanced mixer circuits each of which has a pair of first transistors. Output side terminals of the first transistors are cross-coupled between the two pairs, and first differential signals are supplied to control terminals of the first transistors. Connected in series to each pair of first transistors is a second transistor of a pair of second transistors. The double balanced mixer circuit also includes a differential amplifier circuit including a pair of third transistors, with fourth transistors connected to the pair of third transistors. The fourth transistors function as constant current sources for the pair of third transistors. Second differential signals are supplied to control terminals of the third transistors and differential output terminals of the third transistors are directly coupled to control terminals of the pair of second transistors. The reduced power consumption of the Kamase mixer is achieved with pluralities of active devices, the transistors, being series coupled. A minimum voltage required to satisfactorily operate the mixer is determined by a sum of the minimum collector emitter voltage drops in the greatest number of transistors chained or coupled in series.

The typical power source for present day wireless radio devices, such as cell phones, personal communicators and the like, is preferably of low voltage. Energizing current is usually supplied with a potential of not more than about 3 volts, however such low voltage is less than convenient for the operation of the typical balanced mixer circuit. The dynamic range of the typical balanced mixer operated with such a low supply potential is reduced such as to be impractical. A greater operating potential for the balanced mixer can ameliorate this problem but with consequential added expense and inefficiency of some additional element such as a DC to DC inverter for example.

SUMMARY OF THE INVENTION

It is an object of the present invention to provide a mixer of improved functional linearity while operating with a low voltage power supply as is typically used in a wireless radio device.

In accordance with the invention, a mixer is provided with a single ended input port for receiving radio frequency signals, a balanced input port for receiving local signals and power and ground terminals for energizing the mixer from a low voltage power source. The mixer operates upon input signals, received via the single ended input port and being of desired frequencies, to convert the input signals to output signals with frequencies in a predetermined frequency band. The mixer comprises:

a balanced mixer circuit connected with the power terminal for having energizing current conducted therethrough, connected with the balanced input port for receiving the local signals, and having a pair of input terminals for receiving substantially balanced input signals and a pair of output terminals for providing the output signals;

a differential driver circuit including a first transistor with a collector electrode connected with one of the pair of input terminals of the balanced mixer, a base electrode coupled via a capacitor to the single ended input port, and an emitter electrode coupled via a first resistor to the ground terminal, and a second transistor with a collector electrode connected with the other of the pair of input terminals of the balanced mixer, a base electrode coupled via a capacitor to one of the ground terminal, an emitter electrode coupled via a second resistor to the single ended input port, a fourth resistor connected between the first voltage tap and the base electrode of the second transistor and, a fifth resistor connected between the second voltage tap and the base electrode of the first transistor;

biasing circuit including said first and second voltage taps for providing first and second potentials, the first potential being intermediate a voltage at the power terminal and the second potential and the second potential being at least sufficiently removed from ground for causing a forward current flow between the base and emitter electrodes of the first transistor; and an impedance element connected between the single ended input port and the ground terminal.

In one example of the invention the impedance element is a resistor having an ohmic value suitable for terminating signals received via the single ended input port.

In another example of the invention the impedance element is an active device connected in series with a resistor and responsive to a potential at the second voltage tap for conducting current.

In yet another example of the invention the impedance element is a parallel resonate circuit having a highest impedance in a band of frequencies which include said desired frequencies.

BRIEF DESCRIPTION OF THE DRAWINGS

Examplary embodiments are discussed with reference to accompanying drawings in which.

DESCRIPTION OF THE EXAMPLE EMBODIMENTS

Figure 1:
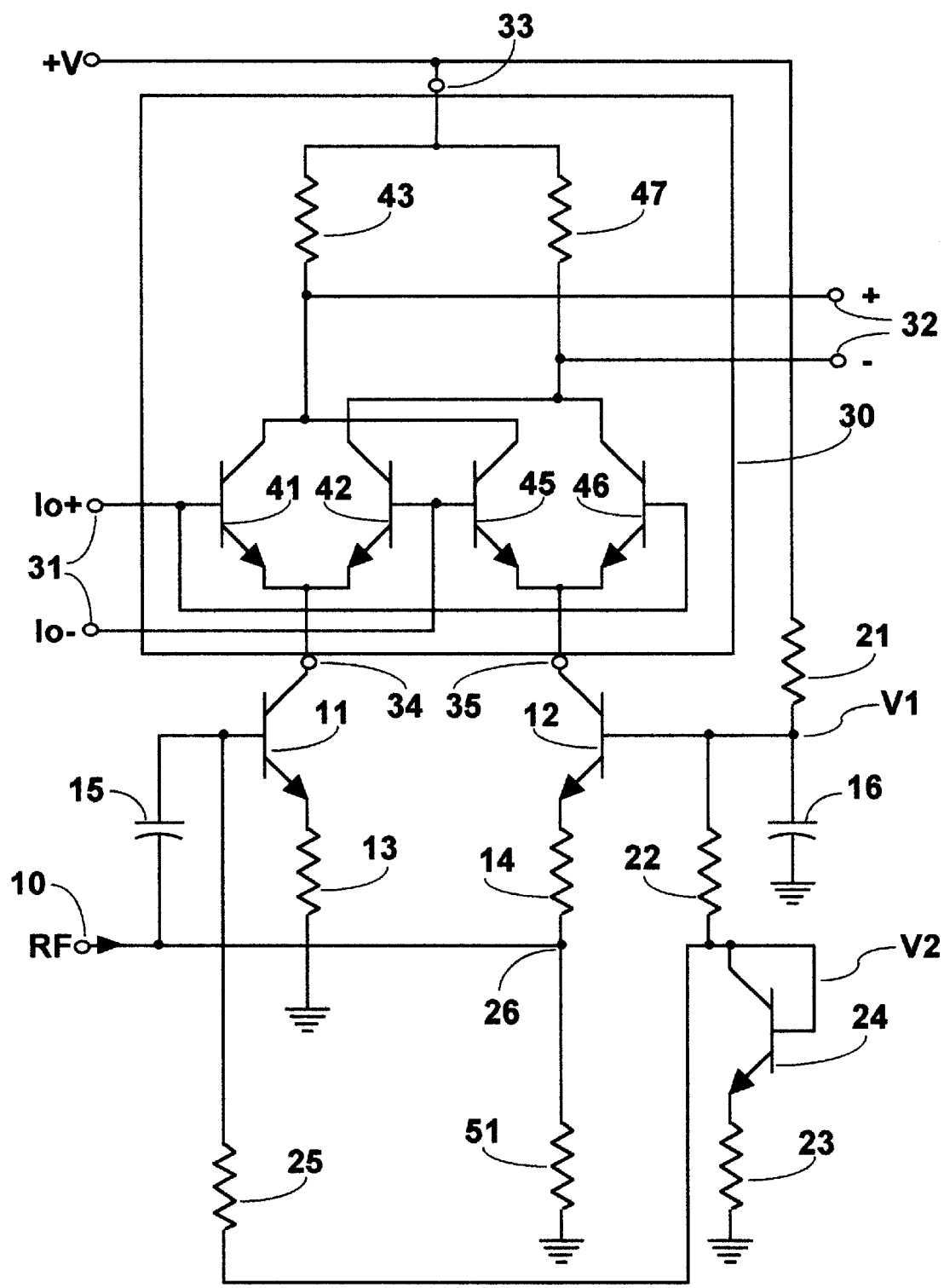
FIGS. 1, 2 and 3 are schematic diagrams of a mixers in accordance with the invention.

In FIG. 1 the mixer is provided with a single ended input port 10, for receiving radio frequency (RF) signals. The mixer is energized for operation with operating power via a power terminal +V and ground terminals. In this example the mixer illustrated is intended for use with a low voltage power source, a 3 volt battery, not shown. Input signals received via the single ended input port 10 and being of desired frequencies are converted by a balanced mixer 30 to output signals which are provided at a balanced signal output port 32.

The balanced mixer circuit 30 includes a first differential amplifier having first and second transistors 41 and 42, and a second differential amplifier having first and second transistors 45 and 46. Collectors of the first transistors 41 and 45 are connected together to a load resistor 43 and collectors of the second transistors 42 and 46 are connected together to a load resistor 47. A plus terminal of a balance output port 32 is connected at the junction of the collectors of the first transistors 41 and 45 with the load resistor 43 and a minus terminal of the balance output port 32 connected at the junction of the collectors of the second transistors 42 and 46 with the load resistor 47. A pair of input terminals 31, labeled lo+ and lo−, are for coupling a balanced radio frequency signal from a variable local oscillator, not shown. Bases of the first transistor 41 and the second transistor 46 are connected to the lo+ input terminal and the bases of the second transistor 42 and the first transistor 45 are connected to the lo− input terminal. Emitters of the transistors 41 and 42 of the first differential amplifier are connected at an input terminal 34 and emitters of the transistors 45 and 46 of the second differential amplifier are connected at an input terminal 35.

A biasing circuit is provided by a voltage divider having a first divider resistor 21 connected in series with the power terminal +V and a first voltage tap V1 at a junction of the first divider resistor 21 and a second divider resistor 22. An active component, in this example a transistor 24, has base and collector electrodes connected in common to provide a second voltage tap V2 at a junction with the divider resistor 22. An emitter of the transistor 24 is coupled to ground via a third divider resistor 23.

A differential driver circuit includes a transistor 11 with a collector connected to the input terminal 34 of the balanced mixer. A base is coupled via a capacitor 15 to the single ended input port 10 and coupled with the second voltage tap V2 via a resistor 25. An emitter electrode is coupled via a resistor 13 to ground. The differential driver circuit also includes a transistor 12 with a collector connected to the input terminal 35 of the balanced mixer. A base is coupled via a capacitor 16 to ground and an emitter is coupled to the single ended input port 10 via resistor 14. The single ended input port is also connected via an impedance element to ground. In this example the impedance element is a resistor 51 being of an ohmic value suitable for terminating signals received via the single ended input port.

The mixer of FIG. 1 is structured to operate from a low voltage source, which in one example is no more than about 3 volts. The bias circuit provides higher and lower bias potentials at the voltage taps V1 and V2. The base emitter forward voltage drop in the transistor 24 added to the voltage drop across the resistor 23 provides bias at the voltage tap V2 for the base emitter junctions of the transistors 11 and 12. In this example the ohmic value of the resistor 13 is similar to the ohmic value of the resistor 14. The higher potential at the voltage tap V1 compensates for the voltage drop across the resistor 51 so that the direct emitter currents of the transistors 11 and 12 are about similar. Resistance values are tailored having regard to the operating potential of any given power source or battery to provide optimum dynamic range and linearity while preferably minimizing the energizing current drain from the battery.

Figure 2:
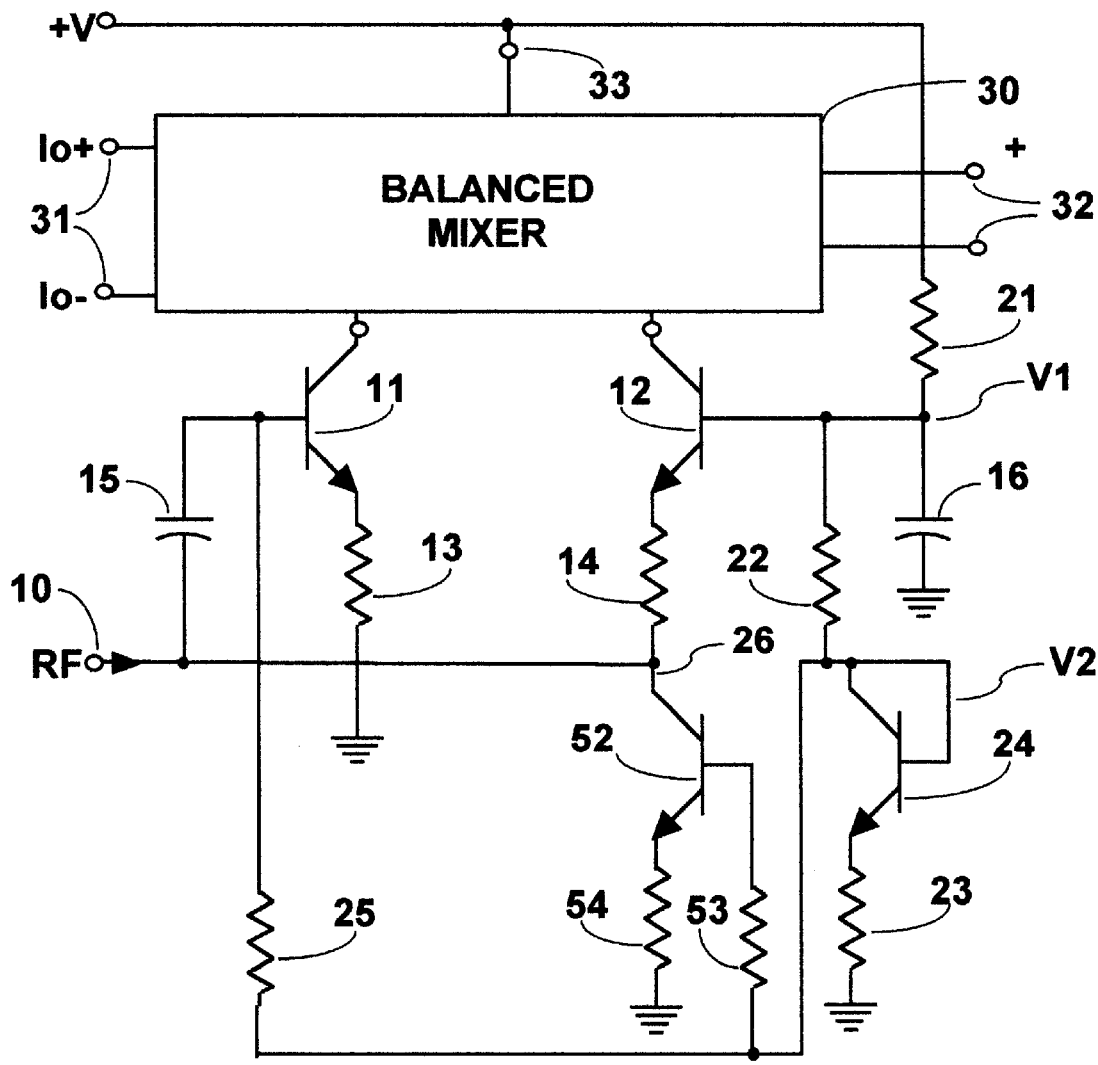

Referring to FIG. 2 the mixer is generally the same as the mixer illustrated in FIG. 1 and similar circuit elements are identified with similar labels. In FIG. 2 as compared to FIG. 1 the impedance element is provided by a transistor 52 having an emitter coupled to ground via a resistor 54. The collector of the transistor 52 is connected to the single ended output port 10 and the base is coupled to the voltage tap V2 by a resistor 53. In this example the resistor 54 is about 5 times the ohmic value of the resistor 23, such that in operation a substantially constant direct current is conducted via the transistor 52 while at the same time the impedance for radio frequency signals is much higher than the effective direct current resistance. One advantage of the example illustrated in FIG. 2 in contrast to the example illustrated in FIG. 1 is that there is virtually no energy loss for radio frequency signals received at the single ended input port and hence the mixer may operate more efficiently.

Figure 3:
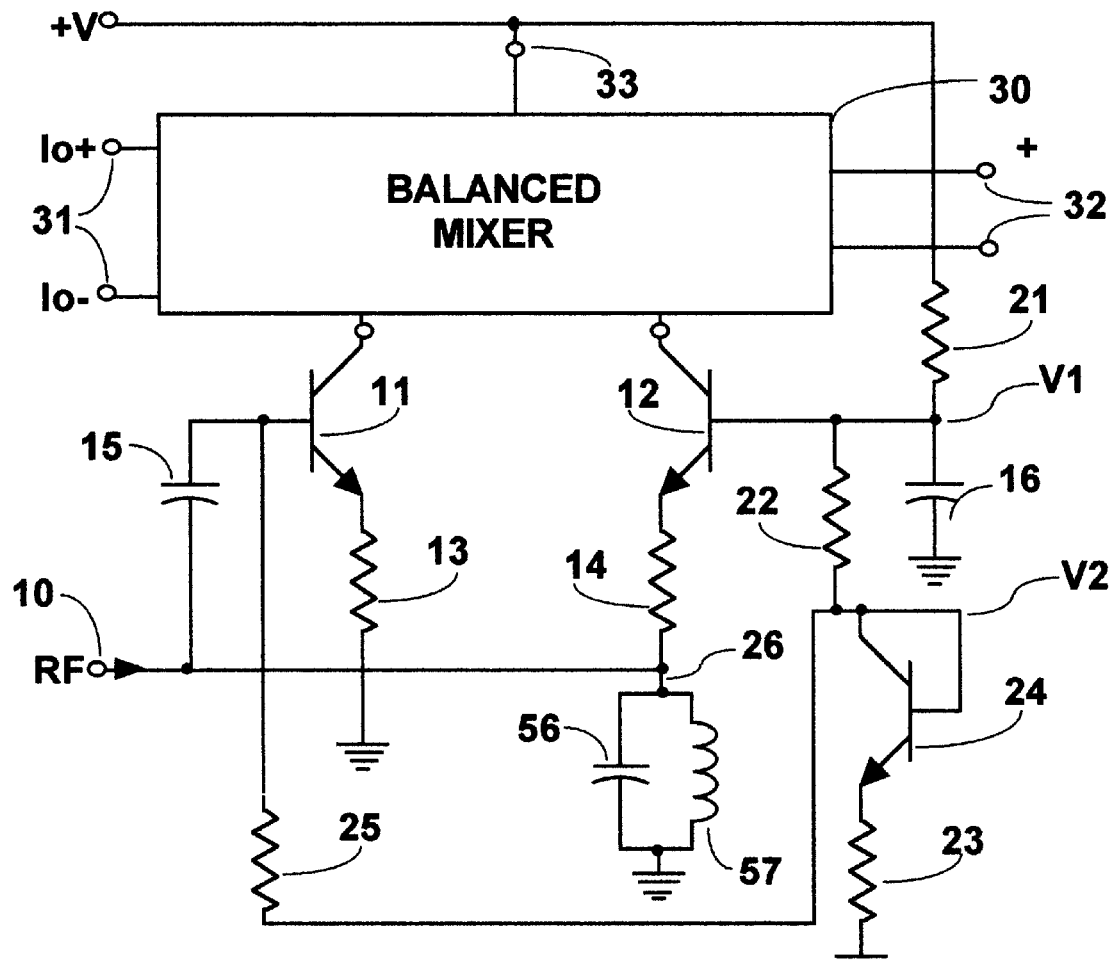

Referring to FIG. 3 the mixer is generally the same as the mixer illustrated in FIG. 1 and similar circuit elements are identified with similar labels. In FIG. 3 as compared to FIG. 1 the impedance element is provided by a parallel resonate circuit, in this example a capacitor 56 and an inductor 57 arranged as illustrated. The values are selected to provide little resistance for direct current while providing a much greater impedance for radio frequency signals in a band desired for reception. One advantage of the example illustrated in FIG. 3 in contrast to the example illustrated in FIGS. 1 and 2 is that in addition to there being very little energy loss for radio frequency signals in a band desired for reception received at the single ended input port, there is very little direct current voltage drop resulting in greater operating headroom, or in other words, greater dynamic range.

Provision of a mixer as illustrated in any of the FIGS. 1, 2 and 3 is envisaged as being in an integrated circuit form. In the mixer illustrated in FIG. 3 however, in view of the relatively large circuit substrate area required for providing an inductive element it is envisaged that such be integrated only in a case wherein the band desired for reception is higher than about 0.5 gigahertz. Otherwise it is believed to be more economical to provide pin out connections for connection of an external inductor.

Readers of the foregoing disclosure, will envision various embodiments within the spirit and scope of the present invention, the breadth of which is of record in the appended claims.

What is claimed is:

1. A mixer with a single ended input port for receiving signals, a balanced input port for receiving local signals and power and ground terminals for energizing the mixer from a low voltage power source whereby in operation, input signals received via the single ended input port and being of desired frequencies are converted to output signals with frequencies in a predetermined frequency band, the mixer comprising:

a balanced mixer circuit connected with the power terminal for having energizing current conducted therethrough, connected with the balanced input port for receiving the local signals, and having a pair of input terminals for receiving substantially balanced input signals and a pair of output terminals for providing the output signals;

biasing circuit including, a voltage divider having a first divider resistor connected in series with the power terminal and a first voltage tap at a junction of the first divider resistor and a second divider resistor, a third divider resistor connected in series with the ground terminal, and a second voltage tap at a junction of the second divider resistor and an active component connected in series between the second divider resistor and the third divider resistor;

a differential driver circuit including a first transistor with a collector electrode connected with one of the pair of input terminals of the balanced mixer, a base electrode coupled via a capacitor to the receive signal terminal, and an emitter electrode coupled via a first resistor to the ground terminal, and a second transistor with a collector electrode connected with the other of the pair of input terminals of the balanced mixer, a base electrode coupled via a capacitor to the ground terminal, an emitter electrode coupled via a second resistor to the single ended input port transistor and, a fifth resistor connected between a second voltage tap and the base electrode of the first transistor;

biasing circuit including said first and second voltage taps for providing first and second potentials, the first potential being intermediate a voltage at the power terminal and the second potential and the second potential being at least sufficiently removed from ground for causing a forward current flow between the base and emitter electrodes of the first transistor; and an impedance element connected between the single ended input port and the ground terminal.

2. A mixer as defined in claim 1, wherein the impedance element is a resistor having an ohmic value suitable for terminating signals received via the single ended input port.

3. A mixer as defined in claim 1, wherein the impedance element is an active device connected in series with a sixth resistor and responsive to a potential at the second voltage tap for conducting current.

4. A mixer as defined in claim 3, wherein the impedance element is a transistor having a collector electrode connected to the single ended input port, an emitter electrode coupled to ground via the sixth resistor and a base electrode coupled with the second voltage tap via a seventh resistor.

5. A mixer as defined in claim 1, wherein the impedance element is a parallel resonate circuit including a capacitive element and an inductive element, having a highest impedance over a band of frequencies which include said desired frequencies.

6. A mixer as defined in claim 1, wherein the balanced input port includes first and second terminals and the balanced mixer circuit comprises:

first and second differential amplifiers each having a pair of transistors being first and second transistors each transistor including base, collector and emitter electrodes; the base electrodes of the first transistor in the first differential amplifier and of the second transistor in the second differential amplifier connected in common to the first terminal of the balanced input port, the base electrodes of the second transistor in the first differential amplifier and of the first transistor in the second differential amplifier connected in common to the second terminal of the balanced input port; the collector electrodes of the first transistors in the first and second differential amplifiers coupled in common via a first resistor to the first power terminal and the collector electrodes of the second transistors in the first and second differential amplifiers coupled in common via a second resistor to the first power terminal; the emitter electrodes of the first and second transistors in the first differential amplifier connected to one input terminal of the pair of input terminals and the emitter electrodes of the first and second transistors in the second differential amplifier connected to another terminal of the pair of input terminals.

7. A mixer as defined in claim 4, wherein the transistor is a bipolar transistor and wherein the control electrode is a base electrode.

8. A mixer as defined in claim 5, being an integrated circuit, exclusive of said inductive element the integrated circuit including means for coupling the inductive element to said capacitive element.

9. A mixer as defined in claim 7, wherein the active component is a transistor having an emitter electrode connected to the third divider resistor, and collector and base electrodes connected in common to the second divider resistor.

* * * * *